US012671393B2

(12) United States Patent
Smith et al.

(10) Patent No.: US 12,671,393 B2
(45) Date of Patent: Jun. 30, 2026

(54) CIRCUITS AND APPARATUS FOR DELIVERING A CONSTANT-CURRENT PULSE WITH STABILITY COMPENSATION INTO LOW IMPEDANCE PYROTECHNIC LOADS

(71) Applicant: The Boeing Company, Arlington, VA (US)

(72) Inventors: Gregory H. Smith, Placentia, CA (US); Kenneth A. Seidner, Fountain Valley, CA (US)

(73) Assignee: The Boeing Company, Arlington, VA (US)

( * ) Notice: Subject to any disclaimer, the term of this patent is extended or adjusted under 35 U.S.C. 154(b) by 262 days.

(21) Appl. No.: 18/637,098

(22) Filed: Apr. 16, 2024

(65) Prior Publication Data
US 2025/0323630 A1    Oct. 16, 2025

(51) Int. Cl.
*H03K 3/011* (2006.01)
*B64D 47/00* (2006.01)
*H03K 17/687* (2006.01)

(52) U.S. Cl.
CPC ............. *H03K 3/011* (2013.01); *B64D 47/00* (2013.01); *H03K 17/687* (2013.01)

(58) Field of Classification Search
CPC ....... H03K 3/011; H03K 17/687; B64D 47/00
USPC ................................................. 361/248, 93.1
See application file for complete search history.

(56) References Cited

U.S. PATENT DOCUMENTS

| | | | | |
|---|---|---|---|---|
| 6,130,813 | A * | 10/2000 | Kates | H02J 1/10 361/93.1 |
| 6,246,559 | B1 * | 6/2001 | Sanders | H02H 3/087 361/93.7 |
| 6,267,326 | B1 | 7/2001 | Smith et al. | |
| 7,206,178 | B2 * | 4/2007 | Friedrichs | H03K 17/08142 361/93.1 |
| 7,286,333 | B2 | 10/2007 | Kubinski et al. | |
| 7,578,481 | B2 | 8/2009 | Smith et al. | |
| 7,839,184 | B2 | 11/2010 | Smith et al. | |
| 8,559,152 | B2 * | 10/2013 | Cao | H02M 3/33507 361/103 |
| 9,250,051 | B1 * | 2/2016 | Smith | F42D 1/055 |
| 9,793,709 | B2 | 10/2017 | Smith et al. | |
| 11,309,880 | B2 * | 4/2022 | Smith | H02H 3/105 |

(Continued)

*Primary Examiner* — Dharti H Patel
(74) *Attorney, Agent, or Firm* — Massey Bean & Lewis

(57) ABSTRACT

Circuits and apparatus for delivering a constant-current pulse with stability compensation into low impedance pyrotechnic loads are disclosed. One apparatus includes a power switch circuit including a high side connectable to an external device and for outputting current to the external device, a current sense circuit connected to the power switch circuit and for monitoring and limiting an amount of the current being output by the power switch circuit, a compensation circuit connected between the current sense circuit and the high side of the power switch circuit. The compensation circuit includes circuitry to provide gain and phase margin over a frequency range that provides stability in the current being output by the power switch circuit over a range of temperatures, input voltages, load impedances, and harness lengths. Systems that include the apparatus and/or perform the operations of the apparatus are also disclosed.

20 Claims, 9 Drawing Sheets

(56)                 References Cited

U.S. PATENT DOCUMENTS

| | | | | |
|---|---|---|---|---|
| 2007/0091527 A1* | 4/2007 | Julicher | ............... | H10D 89/601 |
| | | | | 361/93.1 |
| 2011/0110011 A1* | 5/2011 | Dittfeld | ................ | B60R 21/017 |
| | | | | 327/365 |
| 2015/0280425 A1* | 10/2015 | Kreuter | ................. | H02H 3/006 |
| | | | | 361/93.1 |
| 2016/0105116 A1* | 4/2016 | Chang | ............... | H02M 3/33523 |
| | | | | 363/21.13 |
| 2023/0253777 A1* | 8/2023 | Jackson | .............. | H02H 3/0935 |
| | | | | 361/93.1 |
| 2024/0056041 A1* | 2/2024 | Lehtola | ................ | H03F 1/0222 |

* cited by examiner

800

CIRCUITS AND APPARATUS FOR DELIVERING A CONSTANT-CURRENT PULSE WITH STABILITY COMPENSATION INTO LOW IMPEDANCE PYROTECHNIC LOADS

STATEMENT REGARDING FEDERALLY SPONSORED RESEARCH OR DEVELOPMENT

This invention was made with Government support under NNM07AB03C awarded by the National Aeronautics and Space Administration (NASA). The government has certain rights in this invention.

FIELD

The subject matter disclosed herein relates to aircraft and, more particularly, relates to circuits and apparatus for delivering a constant-current pulse with stability compensation into low impedance pyrotechnic loads.

BACKGROUND

Current drivers are typically used to provide current for a variety of loads including, for example, valves, motors, explosive charges, lighting, resistive loads, and the like. Often, current drivers are utilized in various aeronautical applications such as missiles, manned or unmanned propulsion vehicles, launch vehicles, and spacecraft. In these applications, current drivers may be utilized to provide a current pulse to fire initiators (e.g., NASA Standard Initiators (NSIs) used for pyrotechnic fasteners), fire electronic explosive devices (e.g., squibs, ordnance, etc.), and the like applications. As such, pyrotechnic initiator current drivers in aeronautical applications are often implemented in conjunction with wire harnesses having relatively large lengths. Wire harnesses having relatively large lengths can have operating temperatures, input voltages and/or output load impedances that can cause oscillation and/or instability in the output current of a pyrotechnic initiator current driver.

BRIEF SUMMARY

The subject matter of the present disclosure provides examples of circuits and apparatus for delivering a constant-current pulse with stability compensation into low impedance pyrotechnic loads that overcome the above-discussed shortcomings of prior art techniques. There is a desire to generate a stabile output current from current-limited pyrotechnic initiator drive circuits in applications utilizing relatively large wire harness lengths. The output current can be stabilized by compensating a current-limited pyrotechnic initiator drive circuit to eliminate or at least reduce any oscillation and/or other instability in the output current resulting from the temperature, input voltages, and/or output load impedances of a wire harness having a relatively large length. Accordingly, the subject matter of the present application has been developed in response to the present state of the art, and in particular, in response to shortcomings of conventional current-limited pyrotechnic initiator drive circuits.

Disclosed herein is an apparatus for delivering a current pulse with stability compensation into low impedance pyrotechnic loads. The apparatus includes a power switch circuit including a high side coupleable to an external device and configured to output current to the external device, a current sense circuit coupled to the power switch circuit and configured to monitor and limit an amount of the current being output by the power switch circuit, and a compensation circuit coupled between the current sense circuit and the high side of the power switch circuit. The compensation circuit includes circuitry to provide gain and phase margin over a frequency range that provides stability in the current being output by the power switch circuit over a range of temperatures, input voltages, load impedances, and harness lengths. The preceding subject matter of this paragraph characterizes example 1 of the present disclosure.

The circuitry includes a low pass filter. The preceding subject matter of this paragraph characterizes example 2 of the present disclosure, wherein example 2 also includes the subject matter according to example 1, above.

The low pass filter includes a two-pole low pass filter at fifty hertz (50 Hz). The preceding subject matter of this paragraph characterizes example 3 of the present disclosure, wherein example 3 also includes the subject matter according to any one of examples 1 or 2, above.

The current sense circuit includes a positive-negative-positive (PNP) transistor and the low pass filter includes a first capacitor coupled in series with a first resistor across the PNP transistor, a second capacitor, and a second resistor. The preceding subject matter of this paragraph characterizes example 4 of the present disclosure, wherein example 4 also includes the subject matter according to any one of examples 1 or 2, above.

The first capacitor produces a first single pole low pass filter, the second capacitor produces a second single pole low pass filter, the first resistor comprises a dampening resistor, and the second resistor comprises an isolation resistor. The preceding subject matter of this paragraph characterizes example 5 of the present disclosure, wherein example 5 also includes the subject matter according to any one of examples 1, 2, or 4, above.

The dampening resistor is configured to mitigate parasitic current in the apparatus and the isolation resistor facilitates creation of the first single pole low pass filter and the second single pole low pass filter. The preceding subject matter of this paragraph characterizes example 6 of the present disclosure, wherein example 6 also includes the subject matter according to any one of examples 1, 2, 4, or 5, above.

The first capacitor includes a 0.047 μF capacitor, the second capacitor includes a 0.047 μF capacitor, the first resistor includes a 100Ω resistor, and the second resistor includes a 200Ω resistor. The preceding subject matter of this paragraph characterizes example 7 of the present disclosure, wherein example 7 also includes the subject matter according to any one of examples 1, 2, 4, 5, or 6, above.

The first single pole low pass filter and the second single pole low pass filter each roll-off a feedback loop gain of the apparatus at 50 Hz. The preceding subject matter of this paragraph characterizes example 8 of the present disclosure, wherein example 8 also includes the subject matter according to any one of examples 1, 2, 4, 5, 6, or 7, above.

A system for delivering a current pulse with stability compensation into low impedance pyrotechnic loads is also disclosed. The system includes a pyrotechnic initiator including a high side and a low side and a current driver. The current driver includes a current sense circuit, a power switch circuit coupled to the high side of the pyrotechnic initiator, and a compensation circuit coupled between the current sense circuit and the power switch circuit. The compensation circuit includes circuitry to provide stability over different current loading conditions to the high side of the pyrotechnic initiator. The preceding subject matter of this paragraph characterizes example 9 of the present disclosure.

The circuitry includes a low pass filter. The preceding subject matter of this paragraph characterizes example 10 of the present disclosure, wherein example 10 also includes the subject matter according to example 9, above.

The low pass filter includes a two-pole low pass filter at 50 Hz. The preceding subject matter of this paragraph characterizes example 11 of the present disclosure, wherein example 11 also includes the subject matter according to any one of examples 9 or 10, above.

The current sense circuit includes a PNP transistor and the low pass filter includes a first capacitor coupled in series with a first resistor across the PNP transistor, a second capacitor, and a second resistor. The preceding subject matter of this paragraph characterizes example 12 of the present disclosure, wherein example 12 also includes the subject matter according to examples 9 and 10, above.

The first capacitor produces a first single pole low pass filter, the second capacitor produces a second single pole low pass filter, the first resistor comprises a dampening resistor, and the second resistor comprises an isolation resistor. The preceding subject matter of this paragraph characterizes example 13 of the present disclosure, wherein example 13 also includes the subject matter according to any one of examples 9, 10, or 12, above.

The dampening resistor is configured to mitigate parasitic current in the system and the isolation resistor facilitates creation of the first single pole low pass filter and the second single pole low pass filter. The preceding subject matter of this paragraph characterizes example 14 of the present disclosure, wherein example 14 also includes the subject matter according to any one of examples 9, 10, 12, or 13, above.

The first capacitor includes a 0.047 μF capacitor, the second capacitor includes a 0.047 μF capacitor, the first resistor includes a 100Ω resistor, and the second resistor includes a 200Ω resistor. The preceding subject matter of this paragraph characterizes example 15 of the present disclosure, wherein example 15 also includes the subject matter according to any one of examples 9, 10, 12, 13, or 14, above.

The first single pole low pass filter and the second single pole low pass filter each roll-off a feedback loop gain of the system at 50 Hz. The preceding subject matter of this paragraph characterizes example 16 of the present disclosure, wherein example 16 also includes the subject matter according to any one of examples 9, 10, 12, 13, 14, or 15, above.

Further disclosed is an aircraft. The aircraft includes a control circuit, a pyrotechnic initiator, and a current driver coupled between the control circuit and the pyrotechnic initiator. The current driver includes a current sense circuit, a power switch circuit coupled to the pyrotechnic initiator, and a compensation circuit coupled between the current sense circuit and the power switch circuit. The compensation circuit includes circuitry to provide stability over different current loading conditions to the pyrotechnic initiator. The preceding subject matter of this paragraph characterizes example 17 of the present disclosure.

The circuitry includes a low pass filter, the power switch circuit is coupled to the pyrotechnic initiator via wiring, and the wiring includes a length of at least thirty meters. The preceding subject matter of this paragraph characterizes example 18 of the present disclosure, wherein example 18 also includes the subject matter according to example 17, above.

The low pass filter is a two-pole low pass filter including a first capacitor coupled in series with a first resistor, a second capacitor, and a second resistor. The first capacitor produces a first single pole low pass filter, the second capacitor produces a second single pole low pass filter, the first resistor comprises a dampening resistor configured to mitigate parasitic current in the wiring, and the second resistor includes an isolation resistor facilitating creation of the first single pole low pass filter and the second single pole low pass filter. The preceding subject matter of this paragraph characterizes example 19 of the present disclosure, wherein example 19 also includes the subject matter according to any one of examples 17 or 18, above.

The first capacitor includes a 0.047 μF capacitor, the second capacitor includes a 0.047 μF capacitor, the first resistor includes a 100Ω resistor, and the second resistor includes a 200Ω resistor. The preceding subject matter of this paragraph characterizes example 20 of the present disclosure, wherein example 20 also includes the subject matter according to any one of examples 17-19, above.

The described features, structures, advantages, and/or characteristics of the subject matter of the present disclosure may be combined in any suitable manner in one or more examples and/or implementations. In the following description, numerous specific details are provided to impart a thorough understanding of examples of the subject matter of the present disclosure. One skilled in the relevant art will recognize that the subject matter of the present disclosure may be practiced without one or more of the specific features, details, components, materials, and/or methods of a particular example or implementation. In other instances, additional features and advantages may be recognized in certain examples and/or implementations that may not be present in all examples or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims or may be learned by the practice of the subject matter as set forth hereinafter.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
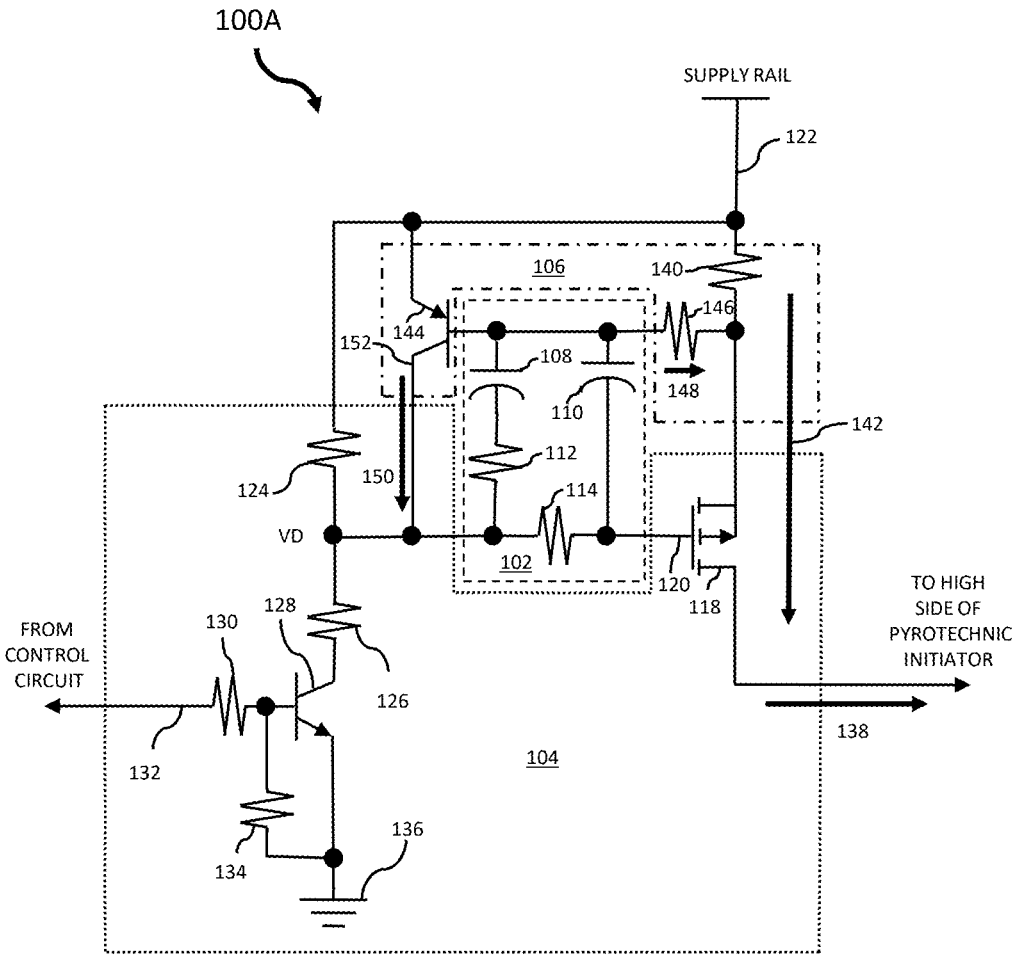
FIG. 1 is a schematic diagram of one embodiment of circuitry for delivering a constant-current pulse with stability compensation into low impedance pyrotechnic loads.

As will be appreciated by one skilled in the art, aspects of the embodiments may be embodied as an apparatus or system. Further, many of the functional units described in this specification have been labeled as circuits to emphasize their implementation independence.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

In addition, as used herein, the term, "set," can mean one or more, unless expressly specified otherwise. The term, "sets," can mean multiples of or a plurality of one or mores, ones or more, and/or ones or mores consistent with set theory, unless expressly specified otherwise.

The description of elements in each figure may refer to elements of proceeding figures. Like numbers refer to like elements in all figures, including alternate embodiments of like elements.

The various embodiments disclosed herein provide apparatus for delivering a constant-current pulse with stability compensation into low impedance pyrotechnic loads. One apparatus includes a power switch circuit including a high side coupleable to an external device and configured to output current to the external device, a current sense circuit coupled to the power switch circuit and configured to monitor and limit an amount of the current being output by the power switch circuit, and a compensation circuit coupled between the current sense circuit and the high side of the power switch circuit. The compensation circuit includes circuitry to provide gain and phase margin over a frequency range that provides stability in the current being output by the power switch circuit over a range of temperatures, input voltages, load impedances, and harness lengths.

The circuitry, in some embodiments, includes a low pass filter. In additional embodiments, the low pass filter includes a two-pole low pass filter at fifty hertz (50 Hz).

In various embodiments, the current sense circuit includes a positive-negative-positive (PNP) transistor. Further, the low pass filter includes a first capacitor coupled in series with a first resistor across the PNP transistor, a second capacitor, and a second resistor. In some embodiments, the first capacitor produces a first single pole low pass filter, the second capacitor produces a second single pole low pass filter, the first resistor comprises a dampening resistor, and the second resistor comprises an isolation resistor.

The dampening resistor, in certain embodiments, is configured to mitigate parasitic current in the apparatus and the isolation resistor facilitates creation of the first single pole low pass filter and the second single pole low pass filter. In additional or alternative embodiments, the first capacitor includes a 0.047 µF capacitor, the second capacitor includes a 0.047 µF capacitor, the first resistor includes a 100Ω resistor, and the second resistor includes a 200Ω resistor. In further additional or alternative embodiments, the first single pole low pass filter and the second single pole low pass filter each roll-off a feedback loop gain of the apparatus at 50 Hz.

Systems for delivering a constant-current pulse with stability compensation into low impedance pyrotechnic loads are also disclosed. One system includes a pyrotechnic initiator including a high side and a low side and a current driver. The current driver includes a current sense circuit, a power switch circuit coupled to the high side of the pyrotechnic initiator, and a compensation circuit coupled between the current sense circuit and the power switch circuit. The compensation circuit includes circuitry to provide stability over different current loading conditions to the high side of the pyrotechnic initiator.

The circuitry, in various embodiments, includes a low pass filter. In certain embodiments, the low pass filter includes a two-pole low pass filter at 50 Hz.

The current sense circuit, in some embodiments, includes a PNP transistor. Further, the low pass filter includes a first capacitor coupled in series with a first resistor across the PNP transistor, a second capacitor, and a second resistor.

In some embodiments, the first capacitor produces a first single pole low pass filter, the second capacitor produces a second single pole low pass filter, the first resistor comprises a dampening resistor, and the second resistor comprises an isolation resistor. The dampening resistor, in some embodiments, is configured to mitigate parasitic current in the system and the isolation resistor facilitates creation of the first single pole low pass filter and the second single pole low pass filter. In certain embodiments, the first capacitor includes a 0.047 µF capacitor, the second capacitor includes a 0.047 µF capacitor, the first resistor includes a 100Ω resistor, and the second resistor includes a 200Ω resistor. In additional or alternative embodiments, the first single pole low pass filter and the second single pole low pass filter each roll-off a feedback loop gain of the system at 50 Hz.

Further disclosed in an aircraft. The aircraft includes a control circuit, a pyrotechnic initiator, and a current driver coupled between the control circuit and the pyrotechnic initiator. The current driver includes a current sense circuit, a power switch circuit coupled to the pyrotechnic initiator, and a compensation circuit coupled between the current sense circuit and the power switch circuit. The compensation circuit includes circuitry to provide stability over different current loading conditions to the pyrotechnic initiator.

In various embodiments, the circuitry includes a low pass filter, the power switch circuit is coupled to the pyrotechnic initiator via wiring, and the wiring includes a length of at least thirty meters. In additional embodiments, the low pass filter is a two-pole low pass filter including a first capacitor coupled in series with a first resistor, a second capacitor, and a second resistor. The first capacitor produces a first single pole low pass filter, the second capacitor produces a second single pole low pass filter, the first resistor comprises a dampening resistor configured to mitigate parasitic current in the wiring, and the second resistor includes an isolation resistor facilitating creation of the first single pole low pass filter and the second single pole low pass filter. In further additional embodiments, the first capacitor includes a 0.047 μF capacitor, the second capacitor includes a 0.047 μF capacitor, the first resistor includes a 100Ω resistor, and the second resistor includes a 200Ω resistor.

Figure 2:
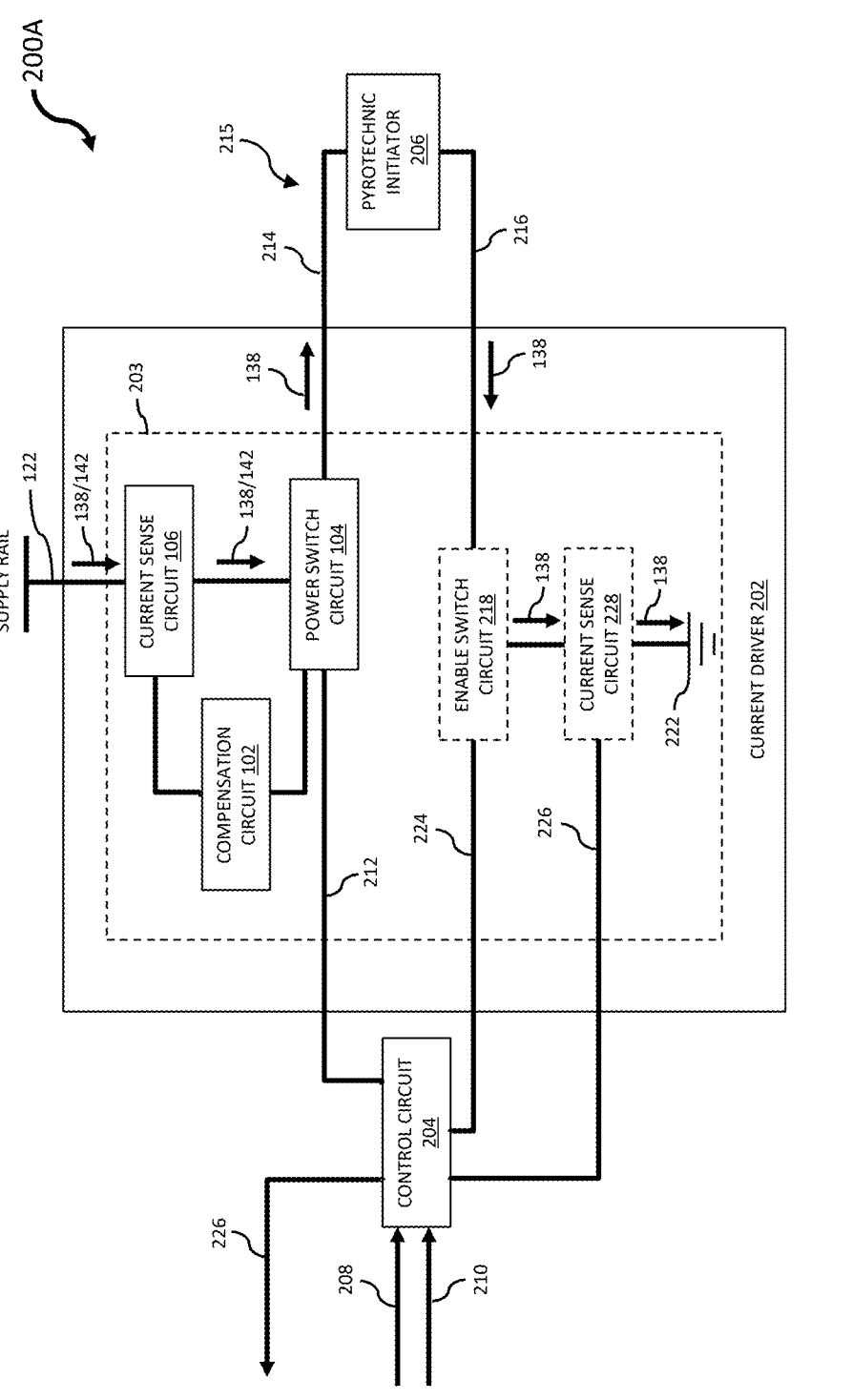
FIG. 2 is a schematic block diagram of one embodiment of a current-limited pyrotechnic initiator drive system.
Figure 4:
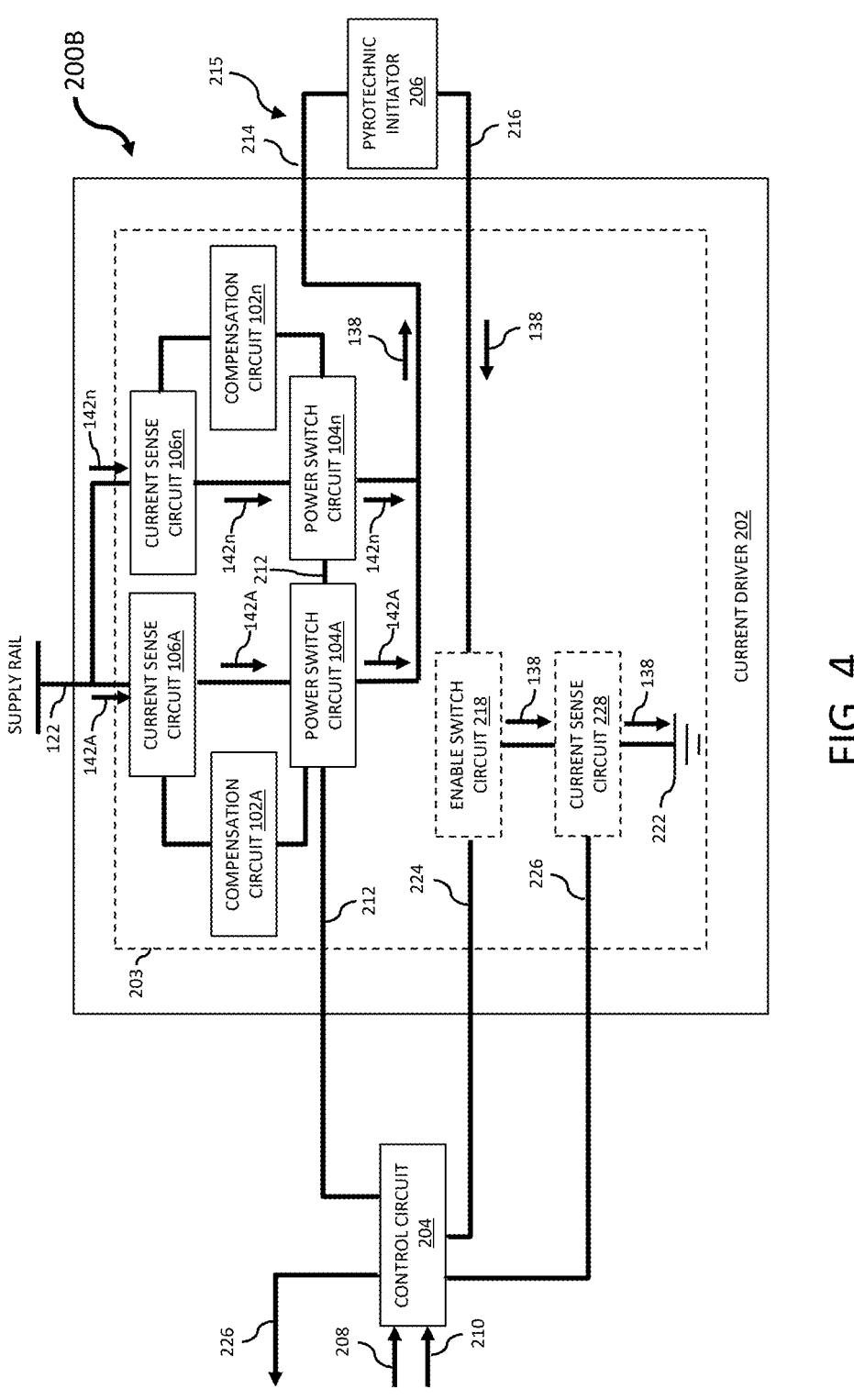
FIG. 4 is a schematic block diagram of another embodiment of a current-limited pyrotechnic initiator drive system.
Figure 5:
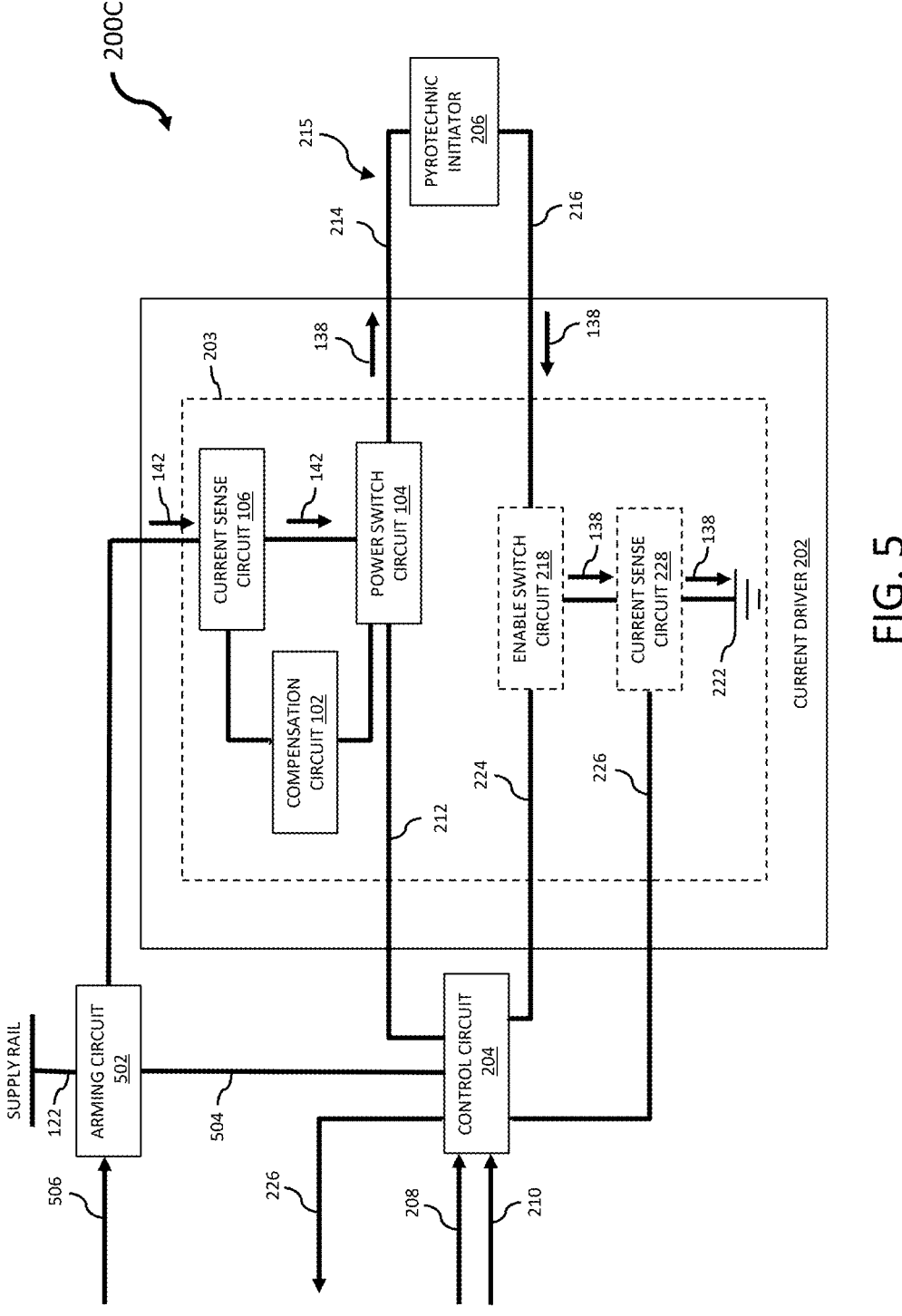
FIG. 5 is a schematic block diagram of still another embodiment of a current-limited pyrotechnic initiator drive system.
Figure 6:
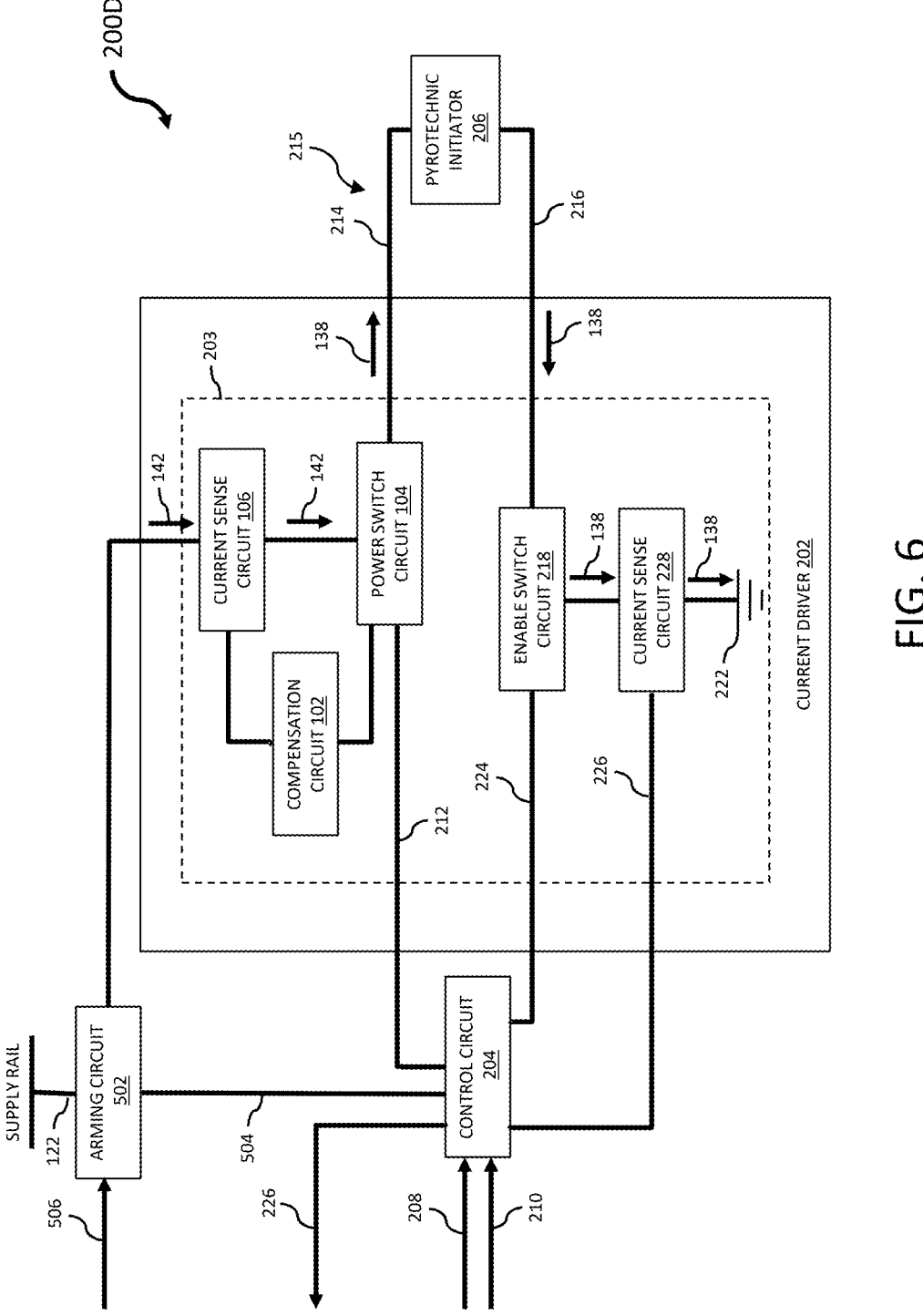
FIG. 6 is a schematic block diagram of yet another embodiment of a current-limited pyrotechnic initiator drive system.

Turning now to the drawings, FIG. 1 is schematic diagram illustrating one embodiment of circuitry 100A for delivering a constant-current pulse with stability compensation into low impedance pyrotechnic loads that can be included as at least a portion of a current-limited pyrotechnic initiator drive system (see, e.g., current-limited pyrotechnic initiator drive system 200A in FIG. 2, current-limited pyrotechnic initiator drive system 200B in FIG. 4, current-limited pyrotechnic initiator drive system 200C in FIG. 5, and current-limited pyrotechnic initiator drive system 200D in FIG. 6). At least in the embodiment illustrated in FIG. 1, the circuitry 100A includes, among other components, a compensation circuit 102, a power switch circuit 104, and a current sense circuit 106. Specifically, the embodiment illustrated in FIG. 1 shows that the compensation circuit 102 is electrically coupled between the power switch circuit 104 and the current sense circuit 106.

A compensation circuit 102 may include any component(s) and/or circuitry that can stabilize the output current from a current-limited pyrotechnic initiator drive circuit provided to a wire harness having a relatively large length. That is, the compensation circuit 102 may include any component(s) and/or circuitry that can eliminate or at least reduce oscillation and/or other instabilities in the output current of a current-limited pyrotechnic initiator drive circuit resulting from the temperature, input voltages, and/or output load impedances generated by a wire harness having a relatively large length.

At least in the illustrated embodiment, the compensation circuit 102 includes, among other components, a capacitor 108, a capacitor 110, a resistor 112, and a resistor 114. In various embodiments, the capacitor 108, the capacitor 110, the resistor 112, and the resistor 114 are electrically coupled to create/form a low pass filter.

The low pass filter created/formed by the capacitor 108, the capacitor 110, the resistor 112, and the resistor 114, in various embodiments, includes a two-pole low pass filter. In certain embodiments, the two-pole low pass filter created/formed by the capacitor 108, the capacitor 110, the resistor 112, and the resistor 114, is a low pass filter at fifty hertz (50 Hz).

The capacitor 108 and the capacitor 110, in various embodiments, each produce a single pole that rolls-off a feedback loop gain at about 50 Hz. The capacitor 108 and the capacitor 110 may each include any suitable size and/or capacitance that is known or developed in the future. In certain embodiments, the capacitor 108 and the capacitor 110 each include a size and/or capacitance of about 0.047 μF. Other embodiments of capacitor 108 and/or capacitor 110 can include sizes and/or capacitances that are greater than and/or less than 0.047 μF (e.g., +/−10% of 0.047 μF).

In various embodiments, the capacitor 108 is electrically coupled in series with the resistor 112. As illustrated in FIG. 1, the capacitor 108 and the resistor 112 are coupled in series across a positive-negative-positive (PNP) transistor 144, which is discussed elsewhere herein with reference to the current sense circuit 106.

In various embodiments, the resistor 112 includes and/or serves as a dampening resistor. As a dampening resistor, the resistor 112 reduces and/or mitigates parasitic current internal to the compensation circuit 102, the circuitry 100A, and/or a current-limited pyrotechnic initiator drive circuit that includes the compensation circuit 102.

The resistor 112 may include any suitable size and/or resistance that is known or developed in the future. In certain embodiments, the resistor 112 includes a size and/or resistance of about 100Ω. Other embodiments of the resistor 112 can include sizes and/or resistances that are greater than or less than 100Ω (e.g., +/−1% of 100Ω).

In various embodiments, the resistor 114 includes and/or serves as an isolation resistor. As an isolation resistor, the resistor 114 allows and/or facilitates creation of the two poles of the two-pole low pass filter by the capacitors 108 and 110.

The resistor 114 may include any suitable size and/or resistance that is known or developed in the future. In certain embodiments, the resistor 114 includes a size and/or resistance of about 200Ω. Other embodiments of the resistor 114 can include sizes and/or resistances that are greater than or less than 200Ω (e.g., +/−1% of 200Ω).

Figure 8:
FIG. 8 is a graph showing one embodiment of stable output signals from the circuits/systems illustrated in FIGS. 1 through 6.
Figure 8:
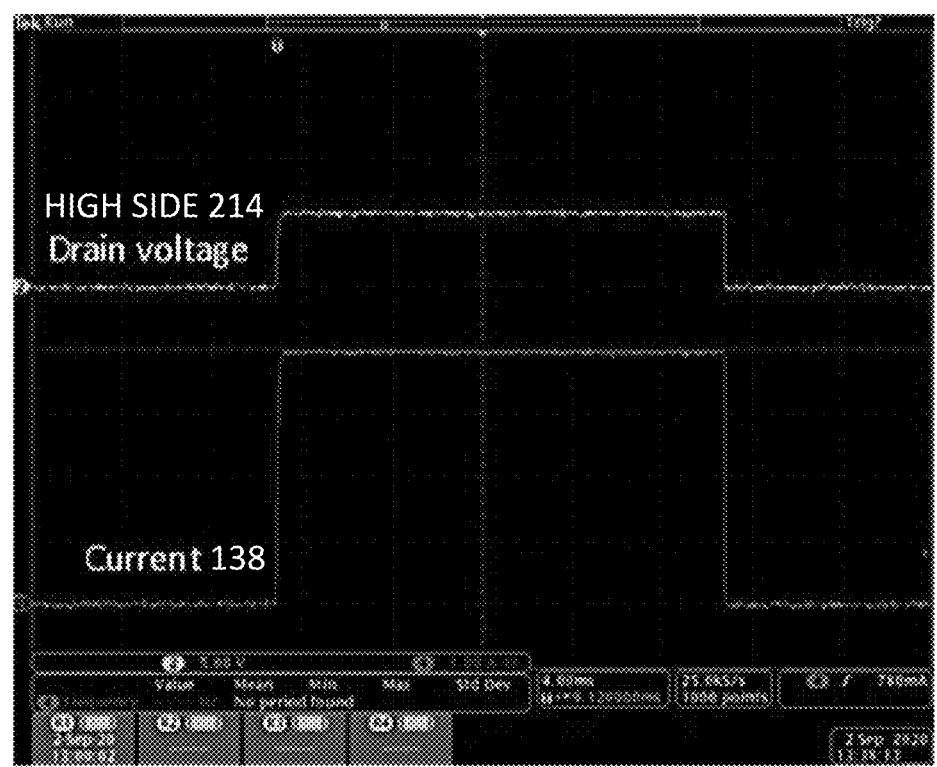

In short, the compensation circuit 102 produces a two-pole low pass filter at 50 Hz. Capacitors 108 and 110 produce a single pole that rolls-off the feedback loop gain at about 50 Hz. The resistor 112 in series with the capacitor 108 that is across the PNP transistor 144 is a damping resistor for mitigating internal circuit parasitics. The resistor 114 serves as an isolation resistor that allows the creation of the two poles from the capacitors 108 and 110. In this configuration, the compensation circuit 102 is able to stabilize the current 138 output from the circuitry 100A by eliminating or at least reducing any oscillation and/or instability in the current 138 caused by the temperature, input voltages, and/or output load impedances generated by a wire harness to an external device (e.g., a pyrotechnic initiator 206) having a relatively large length (e.g., a length greater than or equal to about thirty meters (30 m)), as illustrated in FIG. 8.

At least in the illustrated embodiment, a power switch circuit 104 includes, among other components, a positive-channel metal oxide field-effect transistor 118 (P-channel MOSFET 118) that is controlled by a gate drive signal 120, a supply rail 122, a resistor 124, a resistor 126, a negative-positive-negative (NPN) transistor 128, a base resistor 130, a gate drive signal 132, a resistor 134, ground 136, and a current 138. The gate drive signal 120 is generated by a control circuit 204 (see, e.g., control circuit 204 in FIGS. 2 and 4-6) and the current 138 is provided to a pyrotechnic initiator 206 (see, e.g., pyrotechnic initiator 206 in FIGS. 2 and 4-6).

At least in the illustrated embodiment, a current sense circuit 106 includes, among other components, a sense resistor 140 that generates a voltage differential based on a current 142. The current sense circuit 106 in this embodiment also includes a PNP transistor 144 and a base resistor 146. When the PNP transistor 144 is active, a base current 148 flows across the base resistor 146 in the direction of the arrow. When the PNP transistor 144 is not active, a collector current 150 flows in the direction of the arrow along a signal path 152.

As discussed above, the P-channel MOSFET 118 is controlled by the gate drive signal 120. The voltage of the gate drive signal 120 varies between the voltage of supply rail 122 and a voltage VD at the voltage divider formed by the resistor 124 and the resistor 126. The NPN transistor 128 and the base resistor 130 allow the control circuit 204 (see, e.g., FIG. 2) to vary the gate drive signal 132 by turning the NPN transistor 128 ON and OFF.

When NPN transistor 128 is OFF (e.g., the drive signal 132 is not generated by the control circuit 204), the resistor 124 pulls the gate drive signal 120 to the voltage of the supply rail 122, which operates to turn OFF the P-channel MOSFET 118 (e.g., the channel of P-channel MOSFET 118 is in a high impedance state). In this state, the current 142 is approximately zero. Also, the PNP transistor 144 in the current sense circuit 106 is also OFF since the voltage differential across the sense resistor 140 in the current sense circuit 106 is approximately zero.

When control circuit 204 applies the drive signal 132 to the base resistor 130, the NPN transistor 128 turns ON and the gate drive signal 120 is driven from the voltage of supply rail 122 to the lower voltage of VD based on the voltage divider formed by the resistors 124 and 126. At this point, the P-channel MOSFET 118 is in a saturation mode of operation and the resistance of the channel of P-channel MOSFET 118 is low. Here, current 142 begins to increase towards the threshold current.

Current 142 across the sense resistor 140 generates a voltage differential across the sense resistor 140, which increases as current 142 increases. At some point, the voltage differential will forward bias the PNP transistor 144 (e.g., around 0.7V applied to the base-emitter junction of the PNP transistor 144 (e.g., if the PNP transistor 144 is a silicon transistor) and the base current 148 flows across the base resistor 146 in the direction of the arrow.

As the PNP transistor 144 turns ON, the PNP transistor 144 begins to modify the gate drive signal 120 applied to the P-channel MOSFET 118 by applying a collector current 150 from the PNP transistor 144 along the signal path 152. The collector current 150 operates to charge the gate drive signal 120 towards the voltage of the supply rail 122 by overriding the voltage at VD.

With current 142 at or near the current threshold, the collector current 150 modifies the gate drive signal 120 sufficiently to transition the P-channel MOSFET 118 from a saturation mode of operation into a linear mode of operation. Generally, the programmed current limit for the current 142 is based on the resistance of the sense resistor 140, the base-emitter voltage (vbe) of the PNP transistor 144, the value of the base current 148, and the resistance of the base resistor 146. At the current limit, the voltage differential across the sense resistor 140 will be approximately the vbe of the PNP transistor 144 plus the voltage across the base resistor 146.

Further, when the P-channel MOSFET 118 operates in a linear mode, varying the gate drive signal 120 operates the P-channel MOSFET 118 as a variable resistor, which allows the current sense circuit 106 to vary the output resistance of the power switch circuit 104 and the value of the current 142. For example, when the current 142 is below the threshold current, the collector current 150 is nearly zero, which allows the P-channel MOSFET 118 to operate in a low resistance saturation mode of operation by providing little or no modification to the voltage of the gate drive signal 120. As current 142 approaches the threshold current, the collector current 150 increases, which provides more modification to the gate drive signal 120 and operates to limit current 142 to the threshold current by increasing the resistance across the channel of P-channel MOSFET 118.

FIG. 2 is a block diagram of a current-limited pyrotechnic initiator drive system 200A. At least in the illustrated embodiment, the current-limited pyrotechnic initiator drive system 200A includes, among other components, a current driver 202, a control circuit 204, and a pyrotechnic initiator 206.

A current driver 202 is configured to supply a current 138 to the pyrotechnic initiator 206. A control circuit 204 may include any suitable circuitry and/or component(s) that can coordinate the activities of the current driver 202. Generally, the current-limited pyrotechnic initiator drive system 200A is capable of controlling a duration of the current 138 (e.g., a width of the current pulse) and the peak value of the current 138 (e.g., the current limit of the current pulse) to prevent current damage and/or thermal damage to the current driver 202.

In various embodiments, the pyrotechnic initiator 206 is illustrated as a two-terminal device. In particular, the pyrotechnic initiator 206 is illustrated as including a high side 214 and a low side 216. Generally, the high side 214 of the pyrotechnic initiator 206 is electrically coupled to a power source (not shown) and the low side 216 of the pyrotechnic initiator 206 is electrically coupled to ground.

In various embodiments, the high side 214 includes wiring 215 (e.g., a wire harness) having a relatively long length. The length of the wiring 215 may include any suitable length for a particular application (e.g., any length greater than zero meters (0 m)). In various embodiments, the length of the wiring 215 is at least thirty meters (30 m). In some applications, the length of the wiring 215 can be greater than sixty meters (60 m), eighty meters (80 m), one hundred meters (100 m), or more. While specific lengths of the wiring 215 are stated above, various embodiments of the wiring 215 can also include lengths less than 30 m or greater than 100 m, each possible length greater than 0 m being contemplated herein.

Examples of a pyrotechnic initiator 206 include, but are not limited to, squibs (or initiators for squibs), ordnance (or initiators for ordnance), explosive charges (or initiators for explosive charges), and/or NSIs, etc., among other devices or device initiators that are possible, each of which is contemplated herein. For example, the current driver 202 may be implemented in an aircraft (e.g., an airplane, a manned or unmanned propulsion vehicle, a launch vehicle, a spacecraft, a missile, and/or the like). In some embodiments, the pyrotechnic initiator 206 is configured to detonate explosive devices in a spacecraft (e.g., NASA Standard Initiators (NSIs) coupled to frangible bolts that secure stages of a rocket together).

Although one current channel 203 is illustrated for the current driver 202, the current driver 202 may include any suitable quantity of current channels 203 greater than one current channel 203. For instance, the current driver 202 may include 2, 3, 4, 5, 6, 8, 12, 16, or more current channels 203 that may be operated independently by the control circuit 204. In this regard, any additional current channels 203, although not shown in FIG. 2, include the functions and features described herein for current channel 203 of the current driver 202. Further, the current channel 203, control circuit 204, and any additional current channels 203 implemented by the current driver 202 may be implemented on a Printed Circuit Board (PCB) to enable the current-limited pyrotechnic initiator drive system 200A to include a compact size.

In certain embodiments, the control circuit 204 can include any suitable electronic circuits and/or optical circuits and/or magnetic circuits that are capable of performing control functions for the current driver 202. Examples of a control circuit 204 include, but are not limited to, Programmable Logic Devices (PLDs), Field Programmable Gate Arrays (FPGAs), Digital Signal Processors (DSPs), Processors (e.g., microcontrollers, Central Processing Units (CPUs)), discrete timing circuits, transceivers, and/or Application Specific Integrated Circuits (ASICs), etc., among other devices that are possible, each of which is contemplated herein. In certain embodiments, the control circuit 204 initiates the current 142 in response to a command 208 to apply current 138 to the pyrotechnic initiator 206.

The command 208 may include a signal from an external source (not shown) to initiate current 142 from the supply rail 122. For instance, the command 208 may be received from a spacecraft bus (not shown) to fire one or more NSIs to separate one stage of a rocket from another stage of the rocket by applying an explosive charge to frangible bolts.

In some embodiments, the current driver 202 includes a power switch circuit 104 that is capable of providing current 138 to the pyrotechnic initiator 206 in response to a drive signal 212 from the control circuit 204. For example, the control circuit 204 may generate the drive signal 212 to cause the power switch circuit 104 to current 138 and the control circuit 204 may terminate the drive signal 212 to cause the power switch circuit 104 to terminate the current 138.

The power switch circuit 104 can include any electronic circuits and/or optical circuits and/or magnetic circuits that are capable of initiating and terminating current 138 based on the drive signal 212. In various embodiments, the power switch circuit 104 includes the circuitry and/or components shown in and discussed with reference to FIG. 1.

In general, the power switch circuit 104 may include one or more transistors, such as a Field Effect Transistor (FET). Some examples of a FET include, but are not limited to, a negative-channel Metal Oxide Semiconductor FETs (N-channel MOSFETs) and positive-channel MOSFETs (P-channel MOSFETs). In the illustrated embodiment, the power switch circuit 104 is electrically coupled to a supply rail 122 that provides a power source for current 138.

Although not shown in FIG. 2, the drive signal 212 may include level shifters, opto-isolators, and/or additional circuits along the signaling path from the control circuit 204 to power the power switch circuit 104 that are based on the particular circuit implementation of the current driver 202. For instance, if the power switch circuit 104 includes one or more N-channel FETs (e.g., N-channel MOSFET(s)) that controllably apply current 138 to the high side 214 of the pyrotechnic initiator 206, one or more additional boost circuits may be included along the signaling path for the drive signal 212 to generate a gate-to-source signal on the N-channel FET(s) that is higher than the voltage of supply rail 122. Alternatively, if the power switch circuit 104 includes one or more P-channel FETs (e.g., P-channel MOSFET(s)) that controllably apply the current 138 to the high side 214 of the pyrotechnic initiator 206, one or more additional circuits may be included along the signaling path for the drive signal 212 to generate a gate-to-source signal on the P-channel FET(s) that is lower than the voltage of the supply rail 122.

The current driver 202 in the illustrated embodiment further includes the current sense circuit 106. The current sense circuit 106 can include any suitable electronic circuits and/or optical circuits and/or magnetic circuits that are capable of sensing and/or measuring current 138 and modifying the drive signal 212 to limit the current 138 to a threshold current. In various embodiments, the current sense circuit 106 includes the circuitry and/or components shown in and discussed with reference to FIG. 1.

For example, if the current sense circuit 106 is configured to limit the current 138 to five amps (5A), the current sense circuit 106 may modify the drive signal 212 applied to the power switch circuit 104 to ensure that the current 138 does not exceed five amps, regardless of whether the resistance of the pyrotechnic initiator 206 is zero (e.g., shorted) or the resistance of the pyrotechnic initiator 206 is a non-zero value. This may be useful in cases whereby the resistance of the pyrotechnic initiator 206 varies over a wide range and/or the voltage of the supply rail 122 varies.

For example, firing an NSI may result in a short circuit across the NSI that may cause a high transient current across the power switch circuit 104 when the current 138 is applied to the NSI. This high transient current may cause damage to the power switch circuit 104 that is potentially detrimental to the performance of other current channels implemented by the current driver 202. In another non-limiting example, the supply rail 122 may be supplied by a voltage bus that is unregulated, which would cause the current 138 to vary unless the current 138 was current limited.

In addition to mitigating the effects of a high current transient, the control circuit 204 is further configured to and/or capable of limiting a thermal transient of the power switch circuit 104 by controlling a pulse width and/or a pulse duration of the current 138. For example, when supplying the current 138 to the pyrotechnic initiator 206, the implementation of the power switch circuit 104 may preclude continuous operation of the power switch circuit 104 due to the thermal limits of the power switch circuit 104.

For instance, the active power elements of the power switch circuit 104 may be surface mounted onto a printed circuit board (PCB), which can limit the power dissipation capabilities of the active power elements of the power switch circuit. Thus, the control circuit 204, in various embodiments, is configured to manage a pulse width of the drive signal 212 applied to the power switch circuit 104 based on the thermal performance of the power switch circuit 104 while supplying the current 138 to the pyrotechnic initiator 206.

For example, the power switch circuit 104 may operate one or more FETs in a linear mode to provide a current limit for the current 142 that may result in rapid heating of the FET(s). In some instances, the FET(s) may be damaged or destroyed within a few hundred milliseconds by such rapid heating, which is obviously undesirable. As such, various embodiments of the control circuit 204 may be configured to limit the pulse width of the current 142 to about 25 milliseconds depending on the pre-configured current limit of the current 142, and/or a number of additional factors such as the resistance of the pyrotechnic initiator 206, the voltage of the supply rail 122, the thermal performance of the active power elements that implement the power switch circuit 104, etc.

Figure 3:
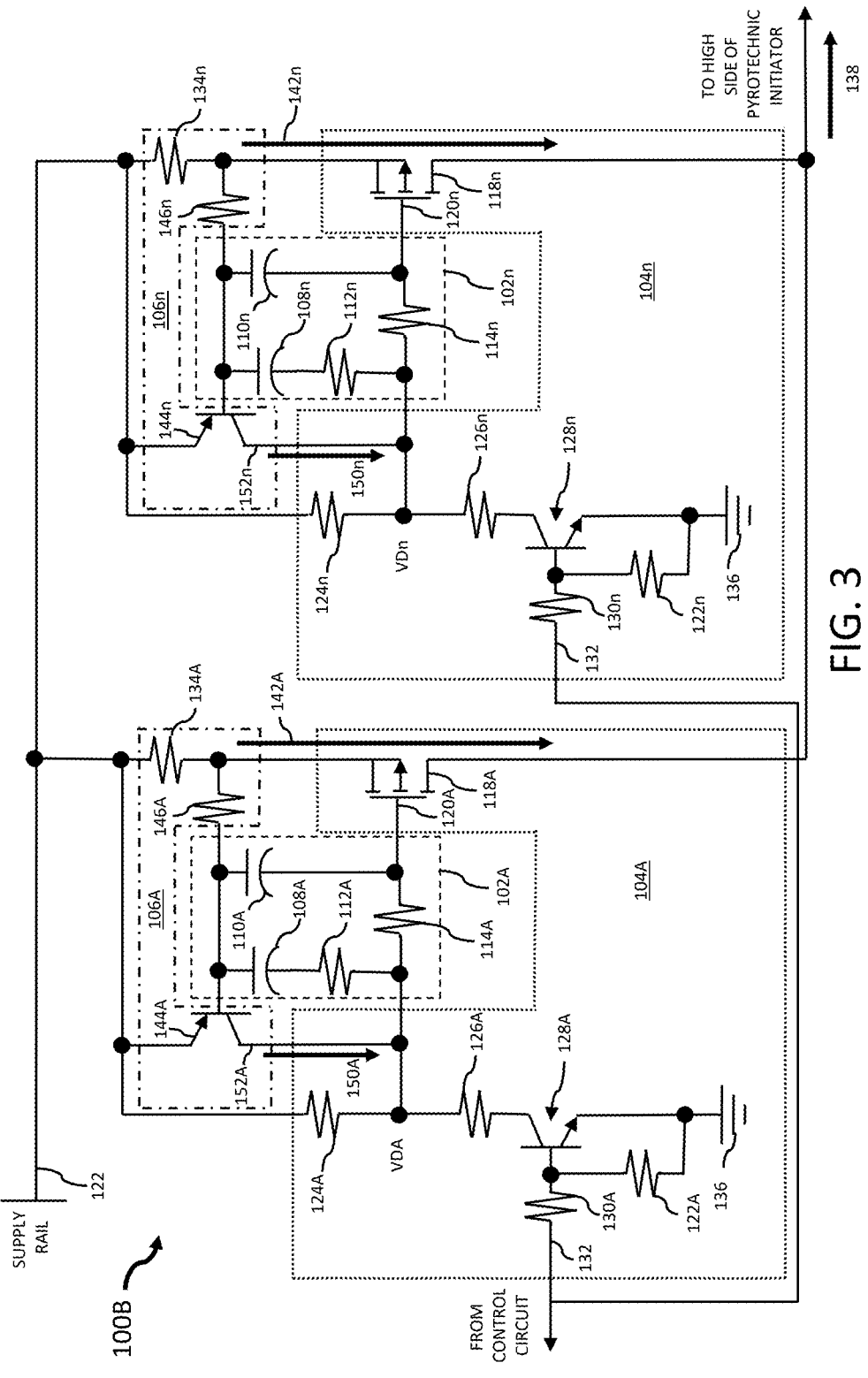
FIG. 3 is a schematic diagram of another embodiment of circuitry for delivering a constant-current pulse with stability compensation into low impedance pyrotechnic loads.

Although one embodiment of the power switch circuit 104 and the current sense circuit 106 are illustrated for the current channel 203, FIGS. 3 and 4 illustrate other embodiments of circuitry 100B and a current-limited pyrotechnic initiator drive system 200B, respectively, that can include a plurality of instances of the compensation circuit 102, the power switch circuit 104, and the current sense circuit 106 in which each instance provides a portion of the current 138 to the pyrotechnic initiator 206. For example, multiple FETs may be individually controllable by their corresponding current sense circuit 106, with each FET supplying a subset of the total of current 138 supplied to the pyrotechnic initiator 206 and the compensation circuit 102 stabilizing the current 142 to generate the current 138 without oscillation or with nominal oscillation (see, e.g., FIG. 8 and FIG. 9).

Embodiments including multiple instances of the compensation circuit 102, the power switch circuit 104, and the current sense circuit 106 may be desirable when the thermal load on a single FET is too great to support the desired current 138 from the current 142 for a current pulse applied to the pyrotechnic initiator 206 and/or when the thermal load of the current 142 on a single FET is too great to support the desired pulse width of the current 138 applied to the pyrotechnic initiator 206. This type of current sharing arrangement allows each FET to carry a portion of the total thermal and current load imposed on the current driver 202 when supplying current 138 to the pyrotechnic initiator 206, while still allowing each FET to be individually controlled to limit the current 142 through each of the FETs.

In some embodiments, the current driver 202 may include an enable switch circuit 218 that is configured to selectively couple a low side 216 of the pyrotechnic initiator 206 to ground 222 based on an enable signal 224 from the control circuit 204. For example, the control circuit 204 may receive an enable command 210 from an external source (not shown) that directs the control circuit 204 to generate the enable signal 224.

The enable signal 224 causes the enable switch circuit 218 to electrically couple the low side 216 of the pyrotechnic initiator 206 to ground 222, thereby providing a current path from the low side 216 of the pyrotechnic initiator 206 to ground 222. In response to not receiving the enable command 210 (e.g., the control circuit 204 effectively receives a disable command), the control circuit 204 may also terminate the enable signal 224 to electrically decouple the low side 216 of the pyrotechnic initiator 206 from ground 222, thereby terminating the current path from the low side 216 of the pyrotechnic initiator 206 to ground 222.

The enable switch circuit 218 may include any suitable electronic circuits and/or optical circuits and/or magnetic circuits that is/are capable of selectively coupling and decoupling the low side 216 of the pyrotechnic initiator 206 to ground 222 based on the enable signal 224. In various embodiments, the enable switch circuit 218 may include one or more transistors, FETs, MOSFETs, etc., among other suitable devices that are possible, each of which is contemplated herein. Although not shown in FIG. 2, the enable signal 224 may include level shifters, opto-isolators, and/or additional circuits along the signaling path from the control circuit 204 to the enable switch circuit 218 that are based on the particular circuit implementation of the current driver 202.

In various embodiments, the current driver 202 may include a current sense circuit 228 that is capable of sensing the current 138 to ground 222 and providing a current sense signal 226 to the control circuit 204, which provides current sense signal 226 back out to the external source. The current sense circuit 228, in some embodiments, is configured to generate the current sense signal 226 in response to the current 138 from the low side 216 of the pyrotechnic initiator 206 to ground 222 exceeding a threshold current, which can indicate to the control circuit 204 that the current 138 has been applied to the pyrotechnic initiator 206.

The current sense circuit 228 may include any suitable electronic circuits and/or optical circuits and/or magnetic circuits that is/are capable of sensing the current 138 to ground 222 and generating the current sense signal 226. Although not shown in FIG. 2, the current sense signal 226 may include level shifters, opto-isolators, and/or additional circuits along the signaling path from the current sense circuit 228 to the control circuit 204 that are based on the particular circuit implementation of the current driver 202.

As discussed above, some embodiments of the current driver 202 may include multiple instances of the compensation circuit 102, the power switch circuit 104, and the current sense circuit 106. FIG. 3 is a schematic diagram of another embodiment of circuitry 100B for delivering a constant-current pulse with stability compensation into low impedance pyrotechnic loads that can be included as at least a portion of a current-limited pyrotechnic initiator drive system.

At least in the illustrated embodiment, the circuitry 100B includes two instances of a compensation circuit 102A/102n, a power switch circuit 104A/104n, and a current sense circuit 106A/106n. While FIG. 3 shows two instances, the circuitry 100B is not limited to two instances and may include a greater quantity of compensation circuits 102, power switch circuits 104, and current sense circuit 106. That is, various other embodiments of the circuitry 100B can include any suitable quantity of compensation circuits 102, power switch circuits 104, and current sense circuit 106 greater than two instances depending on a particular application of the circuitry 100B, current driver 202, and/or a current-limited pyrotechnic initiator drive system 200.

With reference to FIG. 4, another embodiment of a current-limited pyrotechnic initiator drive system 200B is shown. In the current-limited pyrotechnic initiator drive system 200B, the current 138 is provided to the pyrotechnic initiator 206 by aggregating the current 142A from the power switch circuit 104A and the current 142n from the power switch circuit 104n together. Here, the current 138 is the sum of the currents 142A and 142n.

In particular, the current 142A is provided by the power switch circuit 104A and is sensed by the current sense circuit 106A. The current sense circuit 106A monitors the current 142A and limits current 142A to a threshold current by modifying the drive signal 212 applied to the power switch circuit 104A using a signal path through the compensation circuit 102A.

Similarly, the current 142n is provided by the power switch circuit 104n and is sensed by the current sense circuit 106n. The current sense circuit 106n monitors the current 142n and limits current 142n to a threshold current by modifying the drive signal 212 applied to the power switch circuit 104n using a signal path through the compensation circuit 102n.

In some embodiments, the current limit of the current 142A and the current limit of the current 142n are the same value. In alternative embodiments, the current limit of the current 142A and the current limit of the current 142n are different values.

Generally, the use of parallel current sources as illustrated in FIGS. 3 and 4 allow for distributing the current load and thermal load among multiple current sources. For instance, a design specification for particular application may have a peak current and/or a supply voltage and/or a current pulse width that is difficult to implement with one instance of a power switch circuit 104 (see, e.g., FIGS. 1 and 2).

In some embodiments, an arming circuit 502 (see, FIG. 5) may be used to selectively power the supply rail 122. The use of an arming circuit 502 may add another layer of protection. This additional layer of protection may be used to ensure that an NSI is not triggered accidently due to a transient condition in a current driver 202.

For example, in an aircraft 700 (see, FIG. 7), a launch vehicle application, or a spacecraft application, the current driver 202 may be subjected to temperature, vibration, and/or radiation environments that may accidentally trigger an application of the current 138, which is undesirable. Using an arming circuit 502 can ensure that the supply rail 122 is not powered until just prior to firing an NSI and/or other explosive device/ordnance.

FIG. 5 is a block diagram of a current-limited pyrotechnic initiator drive system 200C in another illustrative embodiment. In the illustrated embodiment, an arming circuit 502 is utilized to selectively couple a supply rail 122 to the current driver 202 based on an arming signal 504 to the control circuit 204. For example, the arming circuit 502 may receive an arm command 506 from an external device (not shown) that causes the arming circuit 502 to electrically couple the supply rail 122 to the current driver 202. In further response to receiving the arm command 506, the arming circuit 502 may generate the arm command 506 to the control circuit 204 to notify the control circuit 204 that the current 142 is being supplied to the current driver 202 and the control circuit 204 may transmit a drive signal 212 to the power switch circuit 104 to control the current 138 supplied to the pyrotechnic initiator 206. In response to not receiving an arm command 506 (e.g., the arming circuit 502 receives a disarm command), the arming circuit 502 may electrically decouple the supply rail 122 from the current driver 202 to remove the electrical power from the current driver 202 and also terminate the arming signal 504 to the control circuit 204.

The arming circuit 502 may include any suitable electronic circuits and/or optical circuits and/or magnetic circuits that is/are capable of selectively coupling and decoupling the supply rail 122 from the current driver 202 in response to receiving/not receiving an arm command 506. In various embodiments, the arming circuit 502 may include one or more transistors, FETs, and/or MOSFETs, etc., among other suitable switching device(s)/component(s) that are possible, each of which is contemplated herein. Although not shown in FIG. 5, the arming signal 504 may include level shifters, opto-isolators, and/or additional circuits along the signaling path from the arming circuit 502 to the control circuit 204 that are based on the particular circuit implementation of the current driver 202.

FIG. 6 is a block diagram of a current-limited pyrotechnic initiator drive system 200D in another illustrative embodiment. In the illustrated embodiment, the current-limited pyrotechnic initiator drive system 200D includes an arming circuit 502, an enable switch circuit 218, and a current sense circuit 228. In this embodiment, the current driver 202 is configured to fire a pyrotechnic initiator 206, which is configured to detonate a pyrotechnic device (not shown). For example, the pyrotechnic initiator 206 may include an NSI, an initiator for an ordnance, and/or an initiator for an explosive charge, etc., among other suitable devices that are possible, each of which is contemplated herein.

For example, when current-limited pyrotechnic initiator drive system 200D is operational and the current 138 is not being supplied to the pyrotechnic initiator 206. Here, the supply rail 122 is unpowered and an arming signal 504 is not being transmitted to the control circuit 204 because the arming circuit 502 is OFF (e.g., in a high impedance state), which prevents the supply rail 122 from being electrically coupled to the current driver 202. Further, a drive signal 212 is not being generated by the control circuit 204 and the power switch circuit 104 is in a high impedance state, which prevents the supply rail 122 from electrically coupling to the high side 214 of the pyrotechnic initiator 206. In addition, the enable signal 224 is not being generated by the control circuit 204 and the enable switch circuit 218 is in a high impedance state, which prevents the low side 216 of the pyrotechnic initiator 206 from electrically coupling to ground 222.

Figure 7:
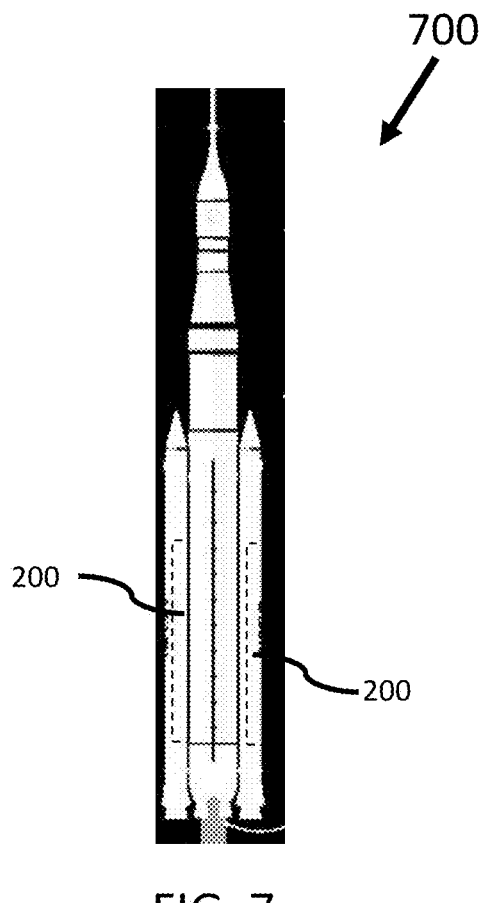
FIG. 7 is a schematic block diagram of one embodiment of an aircraft implementing one or more of the circuits/systems illustrated in FIGS. 1 through 6.

Referring to FIG. 7, one embodiment of an aircraft 700 including is shown. In FIG. 7, the illustrated aircraft 700 includes a rocket (e.g., a spacecraft); however, the various embodiments of an aircraft 700 are not limited to a rocket and/or spacecraft. That is, various other embodiments of an aircraft 700 may include other types of spacecraft and/or aeronautical applications. Further, various other embodiments of an aircraft 700 may include, but are airplanes, missiles, manned or unmanned propulsion vehicles, and/or launch vehicles, etc., among other aeronautical applications that are possible, each of which in contemplated herein.

At least in the illustrated embodiment, the aircraft 700 includes a plurality of current-limited pyrotechnic initiator drive systems 200. Each current-limited pyrotechnic initiator drive system 200 in the aircraft 700 may include any embodiment of a current-limited pyrotechnic initiator drive system 200A, 200B, 200C, or 200D discussed elsewhere herein.

In the illustrated embodiment, the aircraft 700 includes two current-limited pyrotechnic initiator drive systems 200; however, the various embodiments are not limited to two current-limited pyrotechnic initiator drive systems 200. That is, various other embodiments may include a single current-limited pyrotechnic initiator drive system 200 or any suitable quantity of current-limited pyrotechnic initiator drive systems 200 greater than two current-limited pyrotechnic initiator drive systems 200 desired for a particular aircraft 700, application or a current-limited pyrotechnic initiator drive system 200, and/or application of an aircraft 700.

In some embodiments including multiple current-limited pyrotechnic initiator drive systems 200, all of the current-limited pyrotechnic initiator drive systems 200 are the same type of current-limited pyrotechnic initiator drive system 200. In other embodiments including multiple current-limited pyrotechnic initiator drive systems 200, at least two current-limited pyrotechnic initiator drive systems 200 are different types of current-limited pyrotechnic initiator drive systems 200. In still other embodiments including multiple current-limited pyrotechnic initiator drive systems 200, each of the current-limited pyrotechnic initiator drive systems 200 are different types of current-limited pyrotechnic initiator drive systems 200.

As discussed elsewhere herein, the high side 214 of a pyrotechnic initiator 206 of a current-limited pyrotechnic initiator drive system 200 may include wiring 215 (e.g., a wire harness) having a relatively long length, especially in an aircraft 700 and/or in aeronautical applications. In some aircraft 700 and/or in aeronautical applications, the length of the wiring 215 is at least 30 m. In other aircraft 700 and/or in other aeronautical applications, the length of the wiring 215 (e.g., wire harness) can be greater than 60 m, 80 m, meters 100 m, or more, among other suitable lengths that are greater than 100 m or less than 30 m that are possible, each of which is contemplated herein.

With reference to FIG. 8, a graph 800 of the current 138 supplied from the circuitry 100A, 100B and/or the current 138 supplied from the current-limited pyrotechnic initiator drive systems 200A-200D to a pyrotechnic initiator 206 via a relatively long wire harness is shown. As illustrated in the graph 800, the compensation circuit 102 operates to stabilize the current 138 output from circuitry 100A, 100B and/or a current driver 202 of the current-limited pyrotechnic initiator drive systems 200A-200D. In other words, the compensation circuit 102 eliminates or at least reduces the amount of oscillation that would otherwise be present in the current 142 from the supply rail 122 over a range of temperatures, input voltages, and load impedances caused by the wiring 215 (e.g., a wiring harness) from a current driver 202 to a pyrotechnic initiator 206 having a relatively long length (e.g., a length of at least 30 m, 60 m, 80 m, 100 m, etc.).

Figure 9:
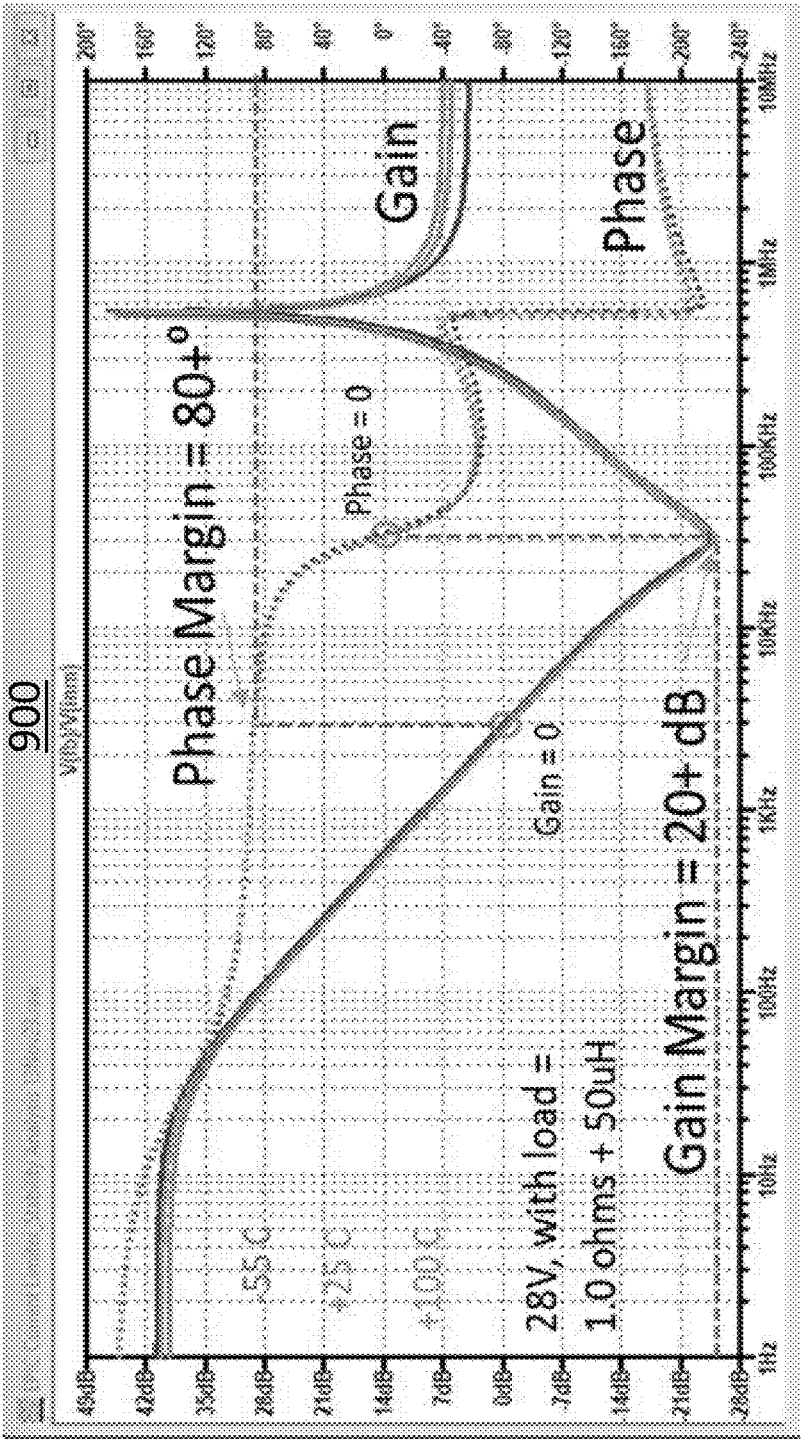
FIG. 9 is a phase gain plot showing one embodiment of a stable response over a frequency with sufficient phase margin and gain margin over a specified temperature range for circuits/systems illustrated in FIGS. 1 through 6.

Referring to FIG. 9, a phase gain plot 900 showing one embodiment of a stable response over a frequency with sufficient phase margin and gain margin over a specified temperature range for circuitry 100A, 100B and/or current-limited pyrotechnic initiator drive systems 200A-200D is shown. As illustrated in FIG. 9, the phase gain margin is greater than or equal to about 45 degrees and the gain margin is greater than or equal to about 10 dB over the specified temperature range. Similar to the graph 800, the phase gain plot 900 shows that the compensation circuit 102 operates to stabilize the current 138 output from circuitry 100A, 100B and/or a current driver 202 of the current-limited pyrotechnic initiator drive systems 200A-200D. That is, the phase gain plot 900 reinforces that the compensation circuit 102 eliminates or at least reduces the amount of oscillation that would otherwise be present in the current 142 from the supply rail 122 over a range of temperatures, input voltages, and load impedances caused by the wiring 215 (e.g., a wiring harness) from a current driver 202 to a pyrotechnic initiator 206 having a relatively long length (e.g., a length of at least 30 m, 60 m, 80 m, 100 m, etc.).

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two." Moreover, unless otherwise noted, as defined herein a plurality of particular features does not necessarily mean every particular feature of an entire set or class of the particular features.

The term "about" or "substantially" in some embodiments, is defined to mean within +/−5% of a given value, however in additional embodiments any disclosure of "about" may be further narrowed and claimed to mean within +/−4% of a given value, within +/−3% of a given value, within +/−2% of a given value, within +/−1% of a given value, or the exact given value. Further, when at least two values of a variable are disclosed, such disclosure is specifically intended to include the range between the two values regardless of whether they are disclosed with respect to separate embodiments or examples, and specifically intended to include the range of at least the smaller of the two values and/or no more than the larger of the two values. Additionally, when at least three values of a variable are disclosed, such disclosure is specifically intended to include the range between any two of the values regardless of whether they are disclosed with respect to separate embodiments or examples, and specifically intended to include the range of at least the A value and/or no more than the B value, where A may be any of the disclosed values other than the largest disclosed value, and B may be any of the disclosed values other than the smallest disclosed value.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc., if used herein, are used merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The schematic flow chart diagrams included herein are generally set forth as logical flow chart diagrams. As such, the depicted order and labeled steps are indicative of one example of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for a current pulse supplied with stability compensation, the apparatus comprising:
   a power switch circuit including a high side coupleable to an external device and configured to output current to the external device;
   a current sense circuit coupled to the power switch circuit and configured to monitor and limit an amount of the current being output by the power switch circuit; and
   a compensation circuit coupled between the current sense circuit and the high side of the power switch circuit, wherein the compensation circuit comprises circuitry to provide gain margin and phase margin over a frequency range that provides stability in the current being output by the power switch circuit over a range of temperatures, input voltages, load impedances, and wiring lengths.

2. The apparatus of claim 1, wherein the circuitry comprises a low pass filter.

3. The apparatus of claim 2, wherein the low pass filter includes a two-pole low pass filter at fifty hertz (50 Hz).

4. The apparatus of claim 2, wherein:
   the current sense circuit comprises a positive-negative-positive (PNP) transistor; and
   the low pass filter comprises:
      a first capacitor coupled in series with a first resistor across the PNP transistor,
      a second capacitor, and
      a second resistor.

5. The apparatus of claim 4, wherein:
   the first capacitor produces a first single pole low pass filter;
   the second capacitor produces a second single pole low pass filter;
   the first resistor comprises a dampening resistor; and
   the second resistor comprises an isolation resistor.

6. The apparatus of claim 5, wherein:
   the dampening resistor is configured to mitigate parasitic current in the apparatus; and
   the isolation resistor facilitates creation of the first single pole low pass filter and the second single pole low pass filter.

7. The apparatus of claim 6, wherein:
   the first capacitor comprises a 0.047 µF capacitor;
   the second capacitor comprises a 0.047 µF capacitor;
   the first resistor comprises a 100Ω resistor; and
   the second resistor comprises a 200Ω resistor.

8. The apparatus of claim 7, wherein the first single pole low pass filter and the second single pole low pass filter each roll-off a feedback loop gain of the apparatus at fifty hertz (50 Hz).

9. A system for a current pulse supplied with stability compensation, the system comprising:
   a pyrotechnic initiator comprising a high side and a low side; and
   a current driver comprising:
      a current sense circuit,
      a power switch circuit coupled to the high side of the pyrotechnic initiator, and
      a compensation circuit coupled between the current sense circuit and the power switch circuit, wherein the compensation circuit comprises circuitry to provide stability over different current loading conditions to the high side of the pyrotechnic initiator.

10. The system of claim 9, wherein the circuitry comprises a low pass filter.

11. The system of claim 10, wherein the low pass filter comprises a two-pole low pass filter at fifty hertz (50 Hz).

12. The system of claim 10, wherein:
   the current sense circuit comprises a positive-negative-positive (PNP) transistor; and
   the low pass filter comprises:
      a first capacitor coupled in series with a first resistor across the PNP transistor,
      a second capacitor, and
      a second resistor.

13. The system of claim 12, wherein:
   the first capacitor produces a first single pole low pass filter;
   the second capacitor produces a second single pole low pass filter;
   the first resistor comprises a dampening resistor; and
   the second resistor comprises an isolation resistor.

14. The system of claim 13, wherein:
   the dampening resistor is configured to mitigate parasitic current in the system; and
   the isolation resistor facilitates creation of the first single pole low pass filter and the second single pole low pass filter.

15. The system of claim 14, wherein:
   the first capacitor comprises a 0.047 µF capacitor;
   the second capacitor comprises a 0.047 µF capacitor;
   the first resistor comprises a 100Ω resistor; and
   the second resistor comprises a 200Ω resistor.

16. The system of claim 15, wherein the first single pole low pass filter and the second single pole low pass filter each roll-off a feedback loop gain of the system at fifty hertz (50 Hz).

17. An aircraft, comprising:
   a control circuit;
   a pyrotechnic initiator; and
   a current driver coupled between the control circuit and the pyrotechnic initiator, the current driver comprising:
      a current sense circuit,
      a power switch circuit coupled to the pyrotechnic initiator, and
      a compensation circuit coupled between the current sense circuit and the power switch circuit, wherein the compensation circuit comprises circuitry to provide stability over different current loading conditions to the pyrotechnic initiator.

18. The aircraft of claim 17, wherein:
   the circuitry comprises a low pass filter;

the power switch circuit is coupled to the pyrotechnic initiator via wiring; and the wiring includes a length of at least thirty meters.

19. The aircraft of claim 18, wherein:

the low pass filter includes a two-pole low pass filter comprising:

a first capacitor coupled in series with a first resistor, a second capacitor, and a second resistor;

the first capacitor produces a first single pole low pass filter;

the second capacitor produces a second single pole low pass filter;

the first resistor comprises a dampening resistor configured to mitigate parasitic current in the wiring; and the second resistor comprises an isolation resistor facilitating creation of the first single pole low pass filter and the second single pole low pass filter.

20. The aircraft of claim 19, wherein:

the first capacitor comprises a 0.047 µF capacitor;

the second capacitor comprises a 0.047 µF capacitor;

the first resistor comprises a 100Ω resistor; and the second resistor comprises a 200Ω resistor.

\* \* \* \* \*